United States Patent [19]
DeTemple et al.

[11] Patent Number: 6,016,027
[45] Date of Patent: Jan. 18, 2000

[54] MICRODISCHARGE LAMP

[75] Inventors: Thomas A. DeTemple; James Frame, both of Champaign; David J. Wheeler, Urbana; J. Gary Eden, Mahomet, all of Ill.

[73] Assignee: The Board of Trustees of the University of Illinois, Urbana, Ill.

[21] Appl. No.: 08/858,235

[22] Filed: May 19, 1997

[51] Int. Cl.[7] ....................................................... H01J 1/16
[52] U.S. Cl. ............................................................ 313/356
[58] Field of Search ..................................... 313/356, 493, 313/631, 491, 496, 618, 574, 311, 326

[56] References Cited

U.S. PATENT DOCUMENTS

| | | | |
|---|---|---|---|
| 3,487,254 | 12/1969 | Vollmer | 313/356 |
| 3,697,797 | 10/1972 | Freyheit et al. | 313/631 |
| 3,908,147 | 9/1975 | Hall et al. | |
| 3,970,887 | 7/1976 | Smith et al. | |
| 4,060,748 | 11/1977 | Bayless | |
| 4,808,883 | 2/1989 | Iwaya et al. | |
| 4,890,031 | 12/1989 | Zwier | |
| 4,988,918 | 1/1991 | Mori et al. | |
| 5,438,343 | 8/1995 | Khan et al. | |
| 5,496,199 | 3/1996 | Makishima et al. | |
| 5,514,847 | 5/1996 | Makishima et al. | |

FOREIGN PATENT DOCUMENTS 0174239  7/1988  Japan ..................................... 313/356

OTHER PUBLICATIONS

A. D. White, "New Hollow Cathode Glow Discharge", *Journal of Applied Physics*, vol. 30, No. 5, May 1959, pp. 771–719.

Schoenbach et al., "Microhollow Cathode Discharge", *Appl. Phys. Lett.* 68(1), Jan. 1, 1996, pp. 13–15.

*Primary Examiner*—Ashok Patel
*Attorney, Agent, or Firm*—Greer, Burns & Crain, Ltd.

[57] ABSTRACT

A microdischarge lamp formed in a one piece integral substrate, preferably a silicon wafer, via micromachining techniques commonly used in integrated circuit manufacture. The lamp includes a micromachined cavity area for enclosing discharge filler, such as mercury vapor. The one piece substrate includes one or more semiconductor regions which act as electrodes for the lamp. A light transmissive cap seals the cavity area. Selection of particular aperture to length ratios for the cavity area permits the lamp to be operated either as a positive column or hollow cathode discharge. Hollow cathode discharge has been demonstrated at pressures of up to about 200 Torr. The small aperture of the cavity area, of about 1 to 400 micrometers, enable the electrons in the discharge to be ballistic. In addition, the small dimensions permit discharges based upon resonance radiation, such as the 253 nm line of atomic mercury.

9 Claims, 5 Drawing Sheets

MICRODISCHARGE LAMP

The present invention concerns a microdischarge lamp. More particularly, the present invention is directed to a hollow cathode geometry microdischarge lamp having a cathode formed in an integral one piece substrate, such as a silicon wafer. A microcavity in the substrate contains discharge filler. The entire substrate may be a semiconductor, or may include semiconductor regions, to thereby form the cathode around the microcavity. Many uses of the microdischarge lamp, including displays and more general lighting applications, will be readily apparent to those skilled in the art.

BACKGROUND OF THE INVENTION

Discharge lamps of different forms have been in use for about a century. Today, gas discharge lamps, such as mercury vapor, sodium vapor and metal halide lamps, continue to be a large segment of the lighting industry. Typically, the lamps are formed from a continuous sealed vessel which holds the vapor or gas, which is electrically excited by a voltage application between spaced apart metal conductor electrodes.

For a given voltage to pressure ratio in a hollow cathode gas discharge lamp, it is well known that the emitted light intensity increases as a function of the pressure within the vessel. However, the pressure is limited by the strength of the vessel material, which must be transparent or translucent to create an effective light source. Another limitation is the diameter of the cathode formed in a traditional manner, typically in metals, which sets a second pressure limitation on operation as a true hollow cathode discharge.

A consideration in displays is resolution, typically defined by pixels per inch. Conventional hollow cathode discharge lamps are formed in metals. In such conventional lamps, currently utilized machining techniques for metals have limited discharge cavity diameters to about 700 $\mu$m or more. Though a #80 drill bit, having a diameter of about 338 $\mu$m, may be used to drill very shallow holes in metals, aspect ratios for hollow cathode operation (about 4:1 depth to aperture) have not been obtained. The potential resolution of a display is accordingly limited to a pixel size which exceeds 700 $\mu$m. The need to combine separate discharge effects for color variation further decreases potential resolution.

One solution to these problems is proposed in U.S. Pat. No. 5,438,343 to Khan et al. That patent contemplates a large number of microcavities, each of which permits a higher pressure than a single large cavity. The microcavities are formed via wafer bonding of two micromachined substrates of fused quartz, sapphire, glass or other transparent or translucent material. Cavities in the separate substrates align to form vessels for containing filler after the substrates are bonded. While a RF "electrodeless" embodiment is disclosed, other embodiments include etched recesses adjacent the vessels in one or both of the substrates for accommodating separate metal electrodes. After the electrodes are deposited or otherwise placed in the recesses to electrically contact the filler, the separate substrates are bonded together through Van der Waal's forces.

Separate plugs are required at the point where the electrodes are located to maintain the vacuum integrity of the vessel. The plug material, which may be glass, is deposited over the metal layer to strengthen the microcavity which forms the filler vessel. This additional step is required to reinforce the cavity, which is weakened by the recess necessary to accommodate a separate electrode. Together, the reliance on Van der Waal's forces to bond separate substrates and the need for reinforcing plugs limit the potential pressure within the vessel, and significantly complicate production of the device. Pressure is also limited by formation of striations in the discharge and arcing. Another difficulty in the Khan lamp concerns the substrate material itself. Sapphire, fused quartz and the other materials used in the Khan patent for transparent or translucent substrates are brittle and difficult to process. The operation of the Khan device is also limited to a positive column discharge by the device geometry.

Others have proposed cavities in hollow metal cathodes having diameters of approximately 700 $\mu$m. As early as 1959, White examined hollow cathode devices having typical diameters of 750 $\mu$m formed in a variety of metals, including molybdenum and niobium. White, "New Hollow Cathode Glow Discharge", J. Appl. Phys. 30, 711 (1959). More recently, Schoenbach produced and studied hollow cathode lamps having cavities with diameters of approximately 700 $\mu$m machined in molybdenum. Schoenbach et al., "Microhollow Cathode Discharges", Appl. Phys. Lett. 68, 13 (1996). The processes used to produce cavities having diameters of approximately 700 $\mu$m in metals are not conducive to mass production, however. In addition, sputtering of metal walls in the cathode limits device lifetime.

Schoenbach also recognized the benefit of cavities smaller than 700 $\mu$m. However, such cavities are not directly machinable in metals by known methods. Though Schoenbach reported an effective cavity of 75 $\mu$m in molybendum, this cavity consisted of a machined hole on the order of 700 $\mu$m forming most of the cathode, and a smaller 75 $\mu$m cathode opening, thus producing a microcavity opening only at the top of the device. This arrangement would not lend itself to mass production, and it is not clear that the performance characteristics of such a two-section cathode would be similar to a true microcavity cathode having a maximum diameter from below about 500 $\mu$m down to about a single micrometer.

Another concern with metal cathode devices is the formation of environmentally hazardous stable compounds when the metal reacts with a compound filler, such as xenon iodide. Such fillers are potentially interesting for their ability to produce emissions similar to the resonance emission of mercury, an environmentally hazardous compound. However, compounds such as xenon iodide tend to react and form stable hazardous compounds with metal cathodes.

Accordingly, it is an object of the present invention to provide a microdischarge lamp that solves several limitations of such conventional lamps.

A further object of the present invention is to provide a microdischarge lamp having at least one microcavity in a one-piece substrate which forms a cathode around the microcavity, where the microcavity has an aperture from about a single micrometer to approximately 400 $\mu$m.

Another object of the present invention is to provide a microdischarge lamp including a microcavity in a silicon substrate which contains a conductive filler, such as gas or vapor, wherein the filler is electrically contacted by a semiconductor cathode formed in the silicon around the microcavity.

Still another object of the present invention is to provide a microdischarge lamp including a microcavity in a silicon substrate which contains a conductive filler, the filler being electrically contacted by one or more semiconductor electrodes formed in the silicon, wherein the lamp is operable as hollow cathode discharge at a pD (pressure diameter)

exceeding approximately 20 Torr-mm depending on the selected ratio of the cavity length to the cavity aperture.

SUMMARY OF THE INVENTION

The present invention concerns a microdischarge lamp having a micromachined microcavity. Integrated circuit micromachining and fabrication techniques are used to form the microcavity in a one-piece substrate, such as a silicon wafer. A semiconductor region of the substrate preferably forms a cathode that surrounds the microcavity. Selection of a sufficient aperture to length ratio for the cavity permits the lamp to be operated as hollow cathode discharge at a pD exceeding about 20 Torr-mm. The small dimensions of the cavity area, on the order of about a single micrometer to about 400 μm, enable the electrons in the discharge to be ballistic. In addition, the small dimensions permit efficient discharge of resonance radiation, such as the 253 nm line of atomic mercury. Arrays of the microdischarge lamp may be used as lighting sources, as flat displays, as high definition flat panel television screens, and in many other devices.

BRIEF DESCRIPTION OF THE DRAWINGS

Other features, objects and advantages of the invention will be made apparent by the detailed description with reference to the drawings, of which.

DETAILED DESCRIPTION OF THE INVENTION

Figure 1A:
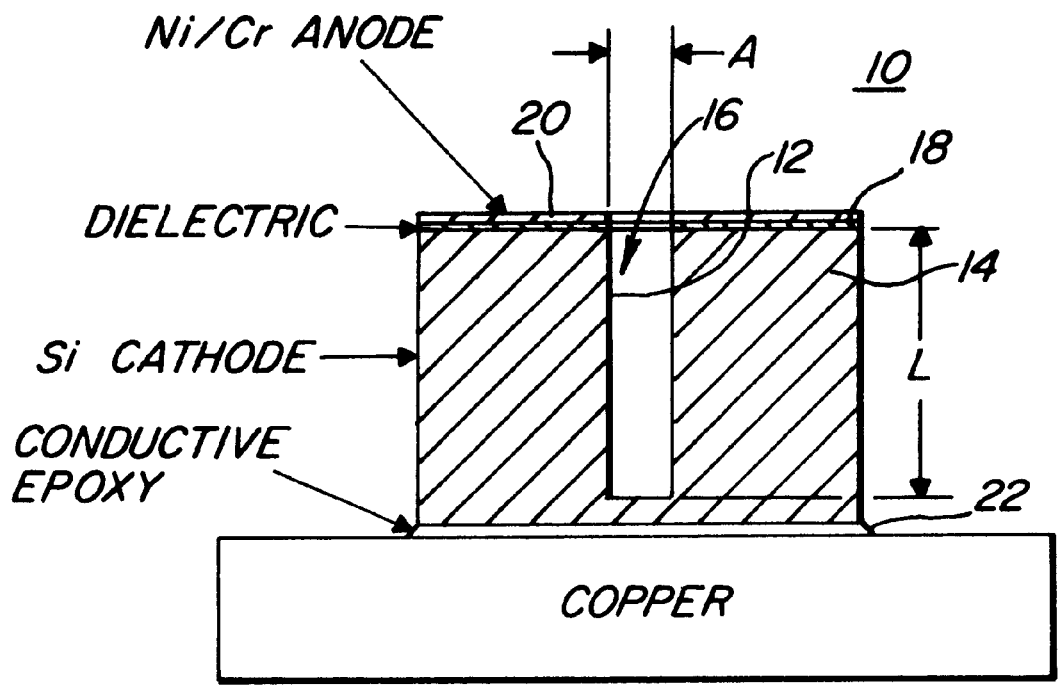
FIG. 1A is a cross section which shows the general structure of a microdischarge lamp formed in accordance with the present invention.

A microdischarge lamp 10 according to the present invention is shown in FIG. 1. The lamp 10 may be formed by using a combination of semiconductor industry fabrication techniques, which are also similar to some techniques used in the field of microelectromechanical systems (MEMS). The lamp 10 has a hollow cathode geometry formed in the shape of a microcavity 12 in a semiconductor substrate 14. Embodiments have been made using a silicon semiconductor, but the similar operational characteristics of Group IV (Ge, diamond), Group III–V (GaAs, InP), and Group II–VI (ZnSe) semiconductors indicate that such substrates may also be utilized for lamps constructed according to the present invention.

General Structure and Operation

The cavity 12 forms the cathode surface, acts as a container for a discharge filler 16, preferably gas or vapor, and defines the volume of discharge for the lamp 10. A dielectric 18, such as silicon dioxide, glass or silicon nitride, is formed on the cathode semiconductor 16, and the lamp is completed by depositing an anode layer 20, which may be a metal such as Ni/Cr, or another layer of semiconductor material, such as polycrystalline silicon. The manner of sealing the discharge will depend upon the type of device that the lamp 10 is incorporated into. For an addressable display of discharge lamps, each cavity or small groups of cavities may be sealed by a common light transmissive cap. Alternative applications, such as large light sources, permit a large grouping of cavities by a common volume extending slightly above the anode 20.

Formation of the microcavity 12 in a single piece integral semiconductor that also acts as an electrode for the lamp 10 renders the microcavity highly pressure tolerant, and avoids the need to form a separate cathode. While a cylindrical microcavity 12 is shown, the discharge volume can be of arbitrary shape. The discharge volume is of very small dimensions, which are limited only by the capability of the integrated circuit fabrication techniques used to form the cavity 12. Plasma etching, ultrasonic machining, and UV laser ablation are suitable fabrication techniques that capable of producing microcavity apertures, e.g. diameter in the case of the illustrated cylinder, from less than a micrometer to about 400 micrometers. Standard photolithography permits an aperture of about 0.3 μm, and e-beam lithography permits even smaller apertures.

The ratio of the length L to the aperture A of the microcavity 12 may accordingly be selected to permit operation of the discharge as either a positive column or hollow cathode discharge. If the length is several times the aperture, the discharge can be made to operate as a hollow cathode, a positive column, or normal glow depending on the gas pressure within the cavity 12. Operation as a hollow cathode produces high energy ielectrons in the discharge which, in turn, allows access to higher energy states of the gaseous atoms or molecules in the discharge which are not readily available in conventional sized discharges. Also, by decreasing the discharge diameter, the discharge can be operated at higher pressures than conventional sized discharges and more precisely approximate a point source.

The arbitrarily small dimensions of the cavity 12 also allow the physical dimensions of the microdischarge to be less than the mean free path for a collision of an electron with another particle. Thus, the electrons in the discharge will be ballistic, producing an energy roughly equal to a voltage applied upon the discharge between cathode 14 and anode 20. Energy may be applied to the cathode 14 through a conductive epoxy 22 via a metal substrate 24, such as copper. Separate contact is made to the anode layer 20.

The cathode material can have a large resistivity and still form a stable discharge. Conventional discharges use metals for the cathode and anode. Presumably, use of a more resistive semiconductor substrate with a hollow cathode geometry would cause the voltage to vary along the length of the cathode. However, the present invention demonstrates the ability to form stable discharges using such materials. The ability to form a discharge in such a substrate allows the use of many established microfabrication techniques, such as those listed above. The preferred semiconducting material, silicon, also compares favorably with metals used in conventional discharges. Silicon has a high resistance to sputtering, can be obtained in nearly arbitrary purity, has a thermal conductivity higher than that of many metals (such as Fe, Ni, or Pd), and has a high melting point (1415° C.). It is also inexpensive and is not environmentally hazardous.

The use of a semiconducting substrate also permits the direct integration of discharge devices with electronic devices. The control and driving circuitry for the discharge can be integrated onto the same substrate as the discharge. In addition, ballast resistors can be formed by tailoring the resistivity of the interconnects.

These combined characteristics allow the lamp 10 to produce light in a manner that is difficult or impossible with a conventional sized discharge. Larger conventional discharge devices acquire ballistic electrons only during impractically low pressures, since the mean free path for a collision between an electron and a gas atom or molecule is given by:

$$\mathcal{L} \equiv \frac{1}{\sigma N}$$

where, N is the number density or gas pressure of the discharge filler and a is the aperture for collision. Thus, raising the gas pressure in a discharge lowers the mean free path. In the microdischarge lamp 10, the dimensions may be chosen to be small enough that the gas pressure can be raised above the value accessible to a conventional discharge, and still operate in a ballistic mode. Manipulation of the electron energy distribution function also permits emission wavelengths not available from conventional larger volume lamps having apertures as small as about 700 $\mu$m.

Additionally, the small aperture also allows the emission of resonance radiation, e.g. electron transitions terminating on ground state and producing photon emissions. Such emissions tend to be intense. One emission of interest is the 253.7 nm line of atomic mercury, which lies in the mid-ultraviolet range, and is effectively used in germicidal applications, polymer curing, and similar applications. A photon produced from such a resonance emission is quickly re-absorbed. For this reason, conventional mercury resonance lamps are typically constructed from heavy wall capillary tubing, and operate at a low partial pressure of mercury (approximately 50 mTorr) to allow the resonance photon to escape the discharge. On the other hand, the present microdischarge lamp 10, having a microcavity aperture of about one to 400 micrometers and having a highly pressure resistant microcavity 12, allow most resonance photons to escape the discharge cavity 12. This permits the discharge aperture to be approximately equal to or less than the mean distance for the absorption of a resonance photon in a discharge at a given pressure. Thus, the microdischarge lamp 10 of the present invention permits most resonance emission photons to escape.

The microdischarge lamp 10 permits operation at glass pressures exceeding several hundred Torr which allows one to produce transient molecular species, such as XeI and $Xe_2$, that are not available in conventional lamps. XeI produces emission in the UV range at 254 $\mu$m, which virtually coincides with the resonance emission of mercury. Consequently, XeI may be used as a substitute for mercury in the lamp of the present invention to avoid the environmental concerns associated with mercury.

Fabrication of the Discharge Lamp 10

Experimental microdischarge lamps according to the present invention have been formed by depositing a metal layer on a portion of a glass microscope slide (soda lime glass). Metals used in the production of the experimental lamps include Cr, Cr followed by Ni, Cr followed by Ni followed by electroplated Ni, and Cr followed by Al. The metal was then patterned into a circular shape roughly 1 cm in diameter by masking with photoresist and etching in a wet etch. Afterwards, the glass was epoxied to a 5 mm cube of single crystal high purity silicon or a 5 mm cube of metallurgical grade silicon. Each experimental lamp was then completed by ultrasonically machining a hole of the desired dimensions by ultrasonic machining.

Mass production of the lamps could be accomplished in alternative ways. The first contemplated method employs contacts to both the front and back sides of the substrate. In the second contemplated method, only contact to the top surface is required and the lamps can be made to be electrically isolated. A third contemplated method includes production of a gas reserve to prolong device lifetime.

The first method begins with a conventionally formed single crystal silicon substrate and is accomplished through the following steps:

1) Grow or deposit a silicon dioxide layer on the substrate to serve as the dielectric insulating layer.
2) Grow or deposit a polysilicon layer to serve as the anode.
3) Pattern and etch the polysilicon to form the desired anode shape.
4) Etch through any backside oxide that may be present to allow contact to the substrate.
5) Mask the sample with photoresist so that the polysilicon anode is exposed where the discharge will be.
6) Etch the polysilicon and silicon dioxide layers.
7) Etch the single crystal silicon substrate using reactive ion etching to form the microcavity cathode.

A preliminary step for the second method is the production of a lightly doped silicon substrate. For simplicity, it is assumed that the substrate is doped to be p-type. However, the method is equally applicable with n-type substrates by substituting p-type diffusions for the n-type diffusions listed below. The second method consists of the following steps, assuming that the starting substrate is lightly doped p-type:

1) Diffuse an n-type layer on the top surface of the substrate. This diffusion may be masked so that only certain areas are diffused.
2) Grow or deposit a silicon dioxide layer to serve as the dielectric insulating layer.
3) Grow or deposit a polysilicon layer to serve as the anode layer.
4) Pattern and etch the polysilicon to form the desired anode shape.
5) Etch through any backside oxide that may be present to allow contact to the substrate, if such contact is desired.
6) Deposit a second layer of dielectric (such as silicon dioxide or silicon nitride) to protect the anode and to prevent discharge forming from the polysilicon not directly adjacent to the cathode.
7) Mask the sample with photoresist to define the discharge.
8) Etch through both dielectric layers and the polysilicon layer to form an opening of the desired microcavity aperture.

9) Reactive ion etch the desired aperture cathode into the substrate.
10) Diffuse n-type dopants into the cathode.
11) Open contacts to the polysilicon layers, the n-type layer, and the p-type substrate.
12) Perform any metallizations required to make contacts off the chip.

In the second method, device isolation can be achieved by reverse biasing, same biasing, or any bias setting blocking current flow through the p-n junctions.

Figure 1B:
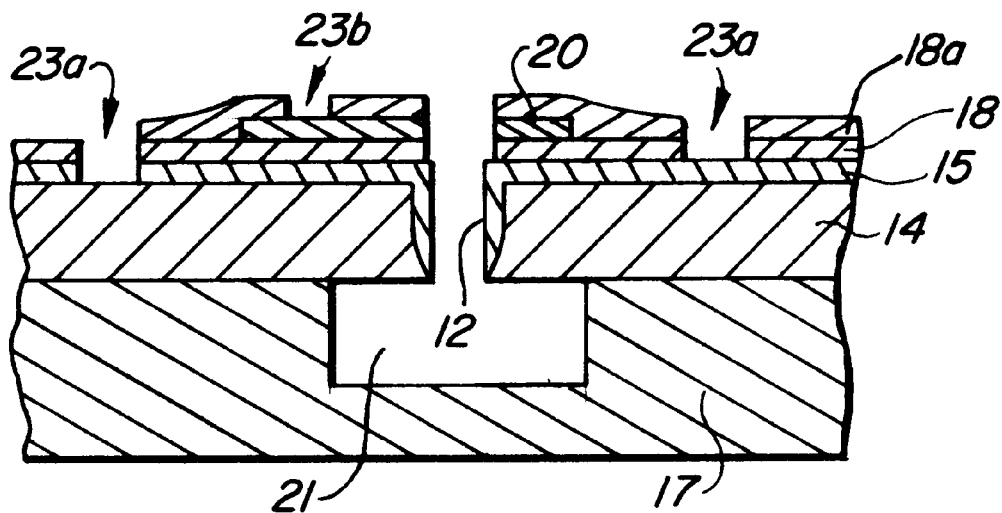
FIG. 1B is a cross section which shows a microdischarge lamp of the present invention including a separate discharge filler reservoir.

Production of a device with a gas reservoir may also be achieved to prolong device life. Such a device is shown in FIG. 1A, where elements common to FIG. 1B use like reference numbers. The substrate 14 is preferably a p-type silicon substrate, including an n-type diffusion region 15 surrounding the cavity 12. An additional n-type silicon substrate 17 forms the reservoir 21 below the cavity 12. Contact holes 23a for the cathode and contact holes 23b for the anode penetrate the dielectric layers 18 which isolate the cathode 15 and anode 20. Such a device may be produced according to the following steps:

1) Diffuse an n-type layer 15 on the top surface of the substrate 14. This diffusion may be masked so that only certain areas are diffused.
2) Grow or deposit a silicon dioxide layer 18 to serve as the dielectric insulating layer.
3) Grow or deposit polysilicon to serve as the anode 20.
4) Pattern and etch the polysilicon to form the desired anode shape.
5) If needed, etch through any backside oxide that may be present.
6) Deposit a second layer of dielectric 18a (silicon dioxide or silicon nitride) to protect the anode and to prevent discharges forming from the polysilicon not directly adjacent to the cathode.
7) Mask the sample with photoresist to define the discharge.
8) Etch the polysilicon and dielectric layers.
9) Etch through the substrate using reactive ion etching to form the cavity 12.
10) Diffuse n-type dopants into the cathode.
11) Take a second substrate, doped n-type, and etch a series of channels or pits.
12) Bond the substrates together such that the cavities or channels are lined up with the discharges. The substrate bonding can be accomplished by fusion bonding, eutectic bonding with a metal such as Al, or bonding to thin silicon dioxide layers on the surfaces to be bonded using anodic bonding or a thin metal layer such as Au.
13) Open contacts 23a to the polysilicon layers, the n-type layer, and the p-type substrate, as well on the backside of the bonded substrate.
14) Perform any metallizations required to make contacts off chip. Using this above procedure allows the direct integration of a gas reservoir 21 into the discharge device. This procedure may substantially increase the device lifetime if the device lifetime is limited by gas depletion.

Performance of Prototype Lamps

Prototype lamps having cylindrical microdischarge cavities from 200–400 μm in diameter (aperture) and 0.5–5 mm in depth, with discharge filler of neon or nitrogen, have been operated at room temperature with specific power loadings beyond 10 kW/cm$^3$. The resultant discharges are azimuthally uniform. Stable operation at $N_2$ and Ne pressures respectively exceeding 1 atm and 600 Torr has been demonstrated for 400 μm diameter devices. Spectroscopic measurements on neon discharges having a 400 μm diameter cylindrical microcavity demonstrate that the device behaves as a hollow cathode discharge for pressures>50 Torr. As shown by emission from Ne and Ne$^+$ states, as well as $N_2$ (C→B) fluorescence (316–492 nm), the microdischarge lamps of the present invention are intense sources of ultraviolet and visible radiation suitable for fabrication as addressable arrays.

Figure 2:
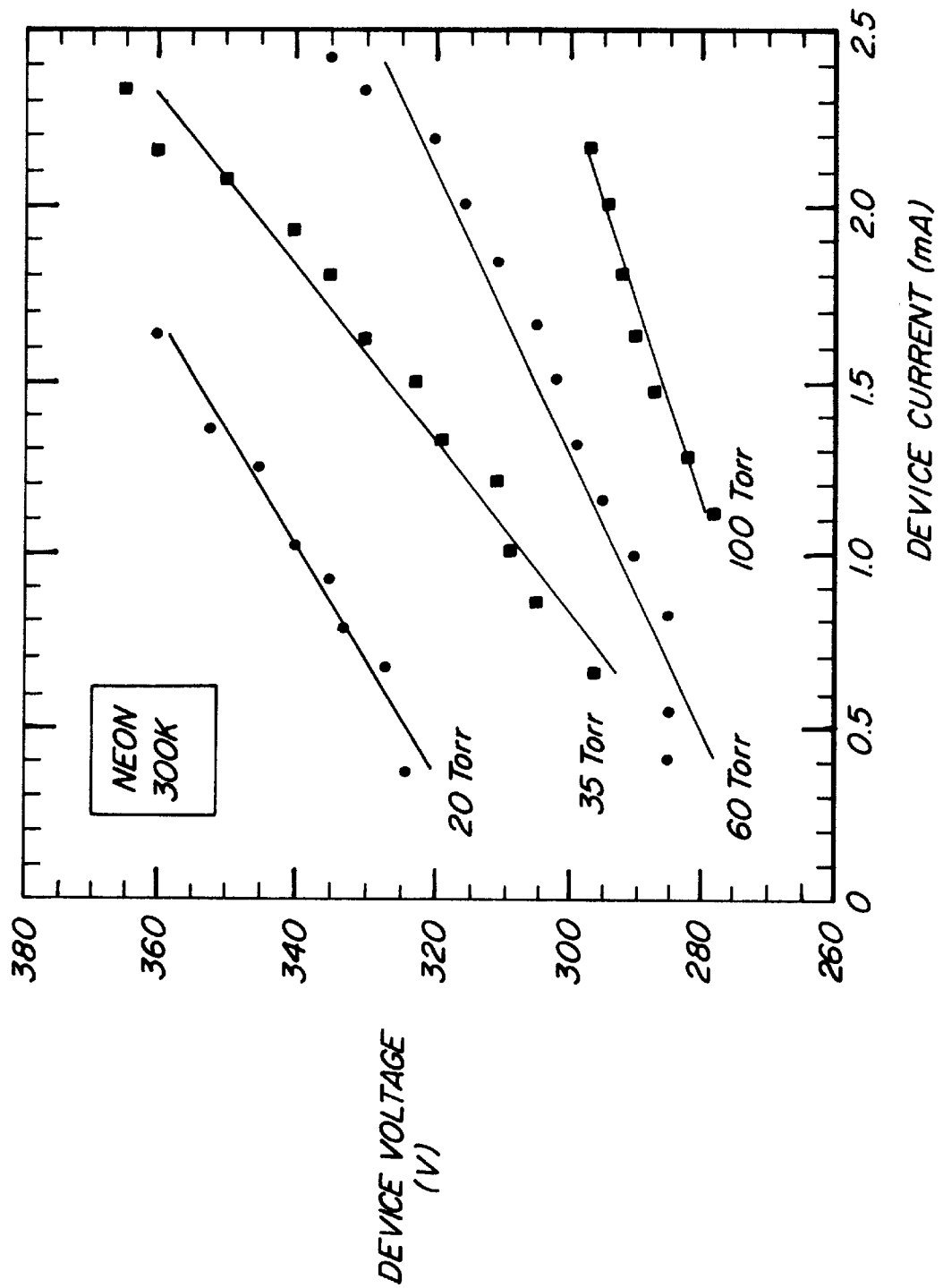
FIG. 2 is a plot of the I–V characteristics for a 400 μm diameter, 1.75 mm long cylindrical aperture microdischarge lamp according to the present invention with a Ne gas filler and at pressures ranging from 20 to 100 Torr.

Referring now to FIG. 2, shown are the current-voltage characteristics of a 400 μm cylindrical aperture lamp having a cavity length of 1.75 mm and a neon discharge filler. The lamp was tested at Ne pressures ranging from 20 to 100 Torr, though similar results were achieved for higher pressures and currents of up to 4 mA. Over the entire current and pressure range, the I–V characteristics demonstrated a positive differential resistivity, while the specific power loading of the discharge ranges from approximately 1 to 4 KW/cm$^3$ on a continuous wave (CW) basis. Pulsed operation should produce similar results, since the continuous wave operation is typically more difficult to achieve. At pressures above 200 Torr and currents above 4 mA, the power loading exceeded 10 kW/cm$^3$ for a 200 μm diameter microdischarge lamp. As a check for power loss through the bulk of the lamp, an electrical probe was inserted into the cylindrical cavity and the resistance between the probe and rear contact was measured to be less than 150Ω. Thus, for currents typical of discharge operation, there is negligible power loss in the silicon substrate of the lamp. Stable glow discharges in Ne are reliably generated in the 400 μm device at pressures exceeding 500 Torr. All the discharges are azimuthally uniform with peak intensity produced on axis.

The operation of the microdischarge lamp may also be characterized by its emission spectra, which serve as a sensitive diagnostic of the transition from hollow cathode operation to normal glow. Though greater than 90% of the total emission produced by a neon discharge lies in the red, the UV range includes transitions that are most sensitive to the electron energy distribution function, and are therefore the best evidence of hollow cathode operation.

Figure 3:
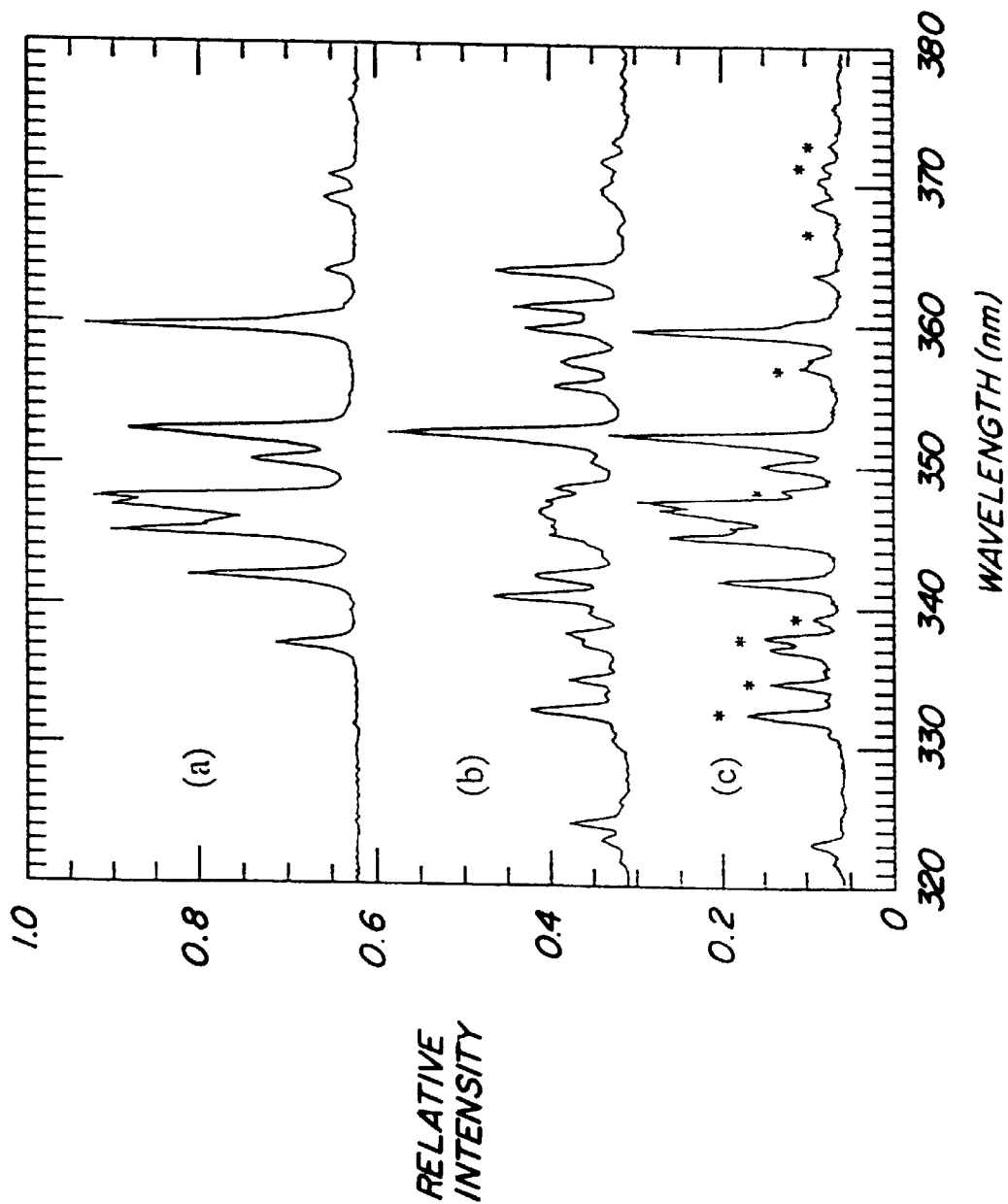
FIG. 3 is a plot that compares emission spectra in the near UV range for a 400 μm diameter, 3.5 mm cylindrical aperture microdischarge lamp with a Ne gas filler according to the present invention with a conventional spectrophotometer hollow cathode lamp and a conventional positive column lamp.

FIG. 3 presents a comparison of the UV spectra in the 320–380 nm region generated by a) a commercial positive column Ne discharge pen lamp; b) a conventional approximately 2.5 mm diameter Ne hollow cathode discharge spectrophotometer lamp; and c) a continuous wave microdischarge lamp constructed in accordance with the present invention (diameter=400 μm, L=3.5 mm, 235 V, 3 mA) operating at 55 Torr (22 Torr-mm). The spectra show that the microdischarge lamp of the present invention behaved as a hollow cathode discharge at pressures exceeding 20 Torr-mm, which is approximately an order of magnitude larger than the pressures at which hollow cathode operation is achieved with conventional devices.

Particularly, all of the lines in the microdischarge spectrum arise from Ne and Ne$^+$, but the latter are present only in the conventional hollow cathode and present 0 microdischarge lamp. The strongest Ne$^+$ spectra (334.55 and 332.38 nm) result from transitions respectively originating from $^2P^o$ and $^2F^o$ states of the ion, which lie approximately 30eV above the Ne (2p$^6$) ground state.

Figure 4:
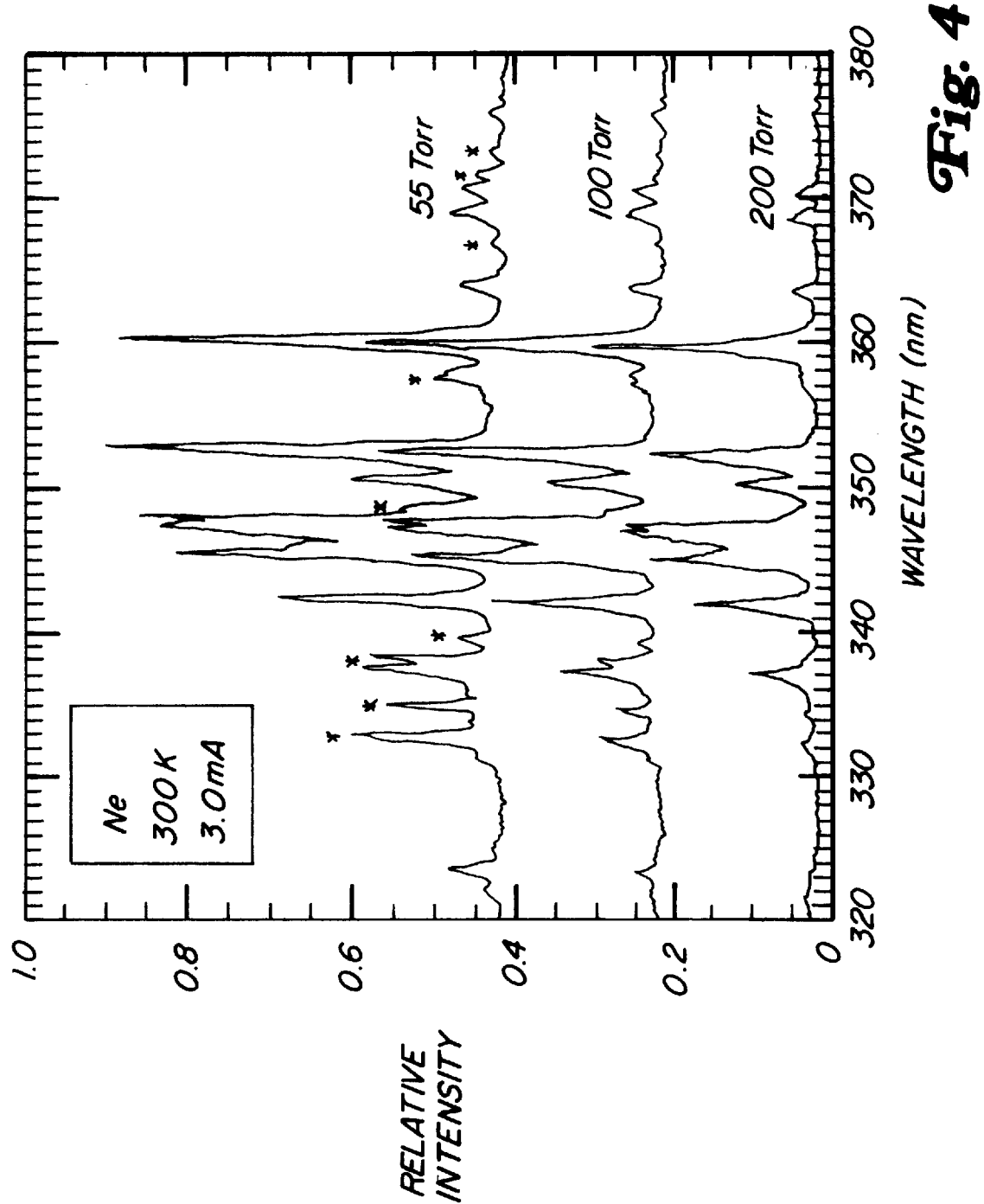
FIG. 4 is a plot shows variation of the spectra of a microdischarge lamp of the invention characterized in FIG. 3 for several Ne gas pressures.

The microdischarge device of the present invention characterized in FIG. 3 underwent a transition to positive column operation at approximately 200 Torr (8 Torr-cm). This is shown in FIG. 4, where the strongest Ne$^+$ and other ion lines from the FIG. 3 plot c) (those indicated with an asterisk) are seen to gradually weaken with increasing gas pressure. At 200 torr, the spectra becomes virtually indistinguishable from the conventional positive column discharge characterized in plot a) of FIG. 3.

Stable microdischarge operation in a microdischarge lamp according to the present invention has also been produced for a pure $N_2$ discharge filler at pressures exceeding 1 atm. Discharges in $N_2$ and air a produce strong $N_2$ (C→B) emission in the UV and visible (316–492 nm; $-6 \leq v'-v'' \leq 1$). Atomic Si emission lines in the 240–300 nm region are extremely weak or undetectable, an expected result given the low sputtering rate for Si by rare gas ions. However, in the $N_2$ microdischarge of the present invention, several strong Cr and Ni transitions between 280 and 311 nm have been observed, the most intense of which lie in the 308–311 nm spectral interval and are attributable to Ni.

Separate tests were conducted in which the dielectric comprised an approximately 1.1 micrometer thick $SiO_2$ film, which was grown on standard 10 cm diameter 0.5 mm thick integrated n-type integrated circuit grade silicon wafer having a resistivity of approximately 5 Ω–cm. Stable discharges according to the present invention, limited in length by the wafer thickness, were generated. This demonstrates that batch processing according to the above-listed and other similar methods for commercial fabrication of lamps according to the present invention is feasible.

Exemplary Devices Incorporating the Present Microdischarge Lamp

Many applications of the present invention will be apparent to skilled artisans. The ability to integrate the lamps with other IC devices suggests that a family of devices, such as microdischarge lamp optical sources, detectors, and associated electronic devices, may be incorporated on a single integrated circuit. 2-D non-addressed arrays, 2-D addressable arrays, and the integration of discharge devices with electronics are considered here as examples of applications for the present microdischarge lamp.

Figure 5:
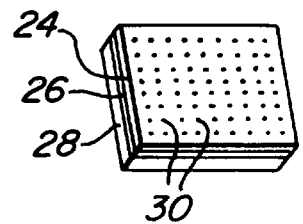
FIG. 5 shows the basic configuration of a 2-D non-addressable array constructed in accordance with the present invention.

A 2-D non-addressable array can be made by increasing the size of the anode and micromachining multiple identical holes into the same cathode. This is shown generally in FIG. 5, where a large single anode 24, dielectric 26, and substrate 28 have been micromachined with an array of cavities 30. The substrate 28 is preferably silicon, the dielectric 26 is preferably silicon dioxide, and the anode is preferably another thin layer of silicon, though a thin metal layer is acceptable since it may be machined to the appropriate aperture cavity. Selection of an appropriate spacing (for Hg about 2 mm or less) between the holes allows the light output from one device to leak into the surrounding devices, causing them to be driven in phase, or coherently.

Figure 6:
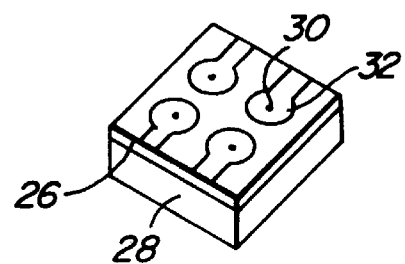
FIG. 6 shows the basic configuration of a 2-D addressable array constructed in accordance with the present invention.

FIG. 6 shows the general structure of a 2-D addressable array, where the anode layer is patterned such that the separate anodes 32 are formed so the separate discharge cavities are not electrically connected. In practice, this may require additional layers on top of the anode layer to prevent discharging at undesired locations. For small scale arrays the individual array elements can be addressed by direct addressing to the anode.

Figure 7:
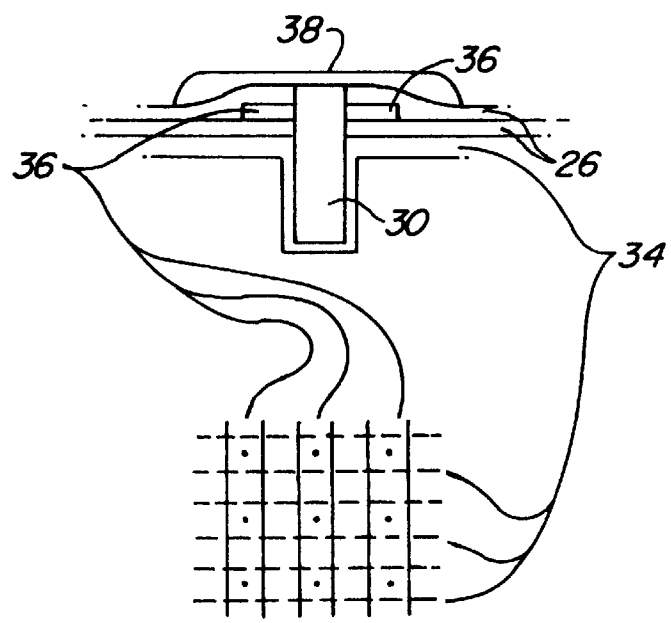
FIG. 7 shows the basic configuration of a crossbar addressed 2-D array constructed in accordance with the present invention.

For larger scale arrays, a cross-bar addressing scheme may be used to electrically isolate the individual devices and produce an addressable array. As seen in FIG. 7, a cross-bar scheme can be implemented by forming cathode rows 34 with n-diffusion regions in a silicon substrate, and columns with polysilicon anodes 36. As shown in FIG. 7, separately addressable arrays also require that individual cavities 30, or groups of cavities forming a single pixel, be sealed by a cap 38 of light transmissive material, such as glass. Whenever multiple cavities outputs may be combined, such as in a non-addressable array, the cap 38 may allow a small volume above the cavities to be common to separate cavities. A cap 38 that covers an individual device or groups of devices can be made by etching the desired pattern in glass and bonding or otherwise attaching the glass cover to the topside of the finished substrate. In order to attain electrical contact, the leads must be patterned such that they run can be contacted in an area outside the area of the bonded cover.

Integration of electronics with the discharge can be accomplished by providing isolation junctions that can withstand the discharge voltage. In this way the substrate around the discharge can be electrically isolated from the electronics. Additionally, passivation layers are necessary to cover any part of the circuitry exposed to the gas or the discharge to prevent physical and electrical damage to or interference with the underlying circuitry. The integration of transistor circuitry around an array that is not addressable allows the array stability to be optimized by controlling the exact current fed to each device. The integration of circuitry around an addressable array also allows storage characteristics, in which only a single enabling signal is sent to each pixel to toggle it on or off.

Such devices and other devices may be formed incorporating the discharge lamp according to the present invention. From the above description, artisans will appreciate that the microdischarge lamp of the present invention provides many advantages. The full scope of the invention is not limited to the illustrated embodiments, however, but is determinable with reference to the appended claims and their legal equivalents.

We claim:

1. A discharge lamp comprising:
   a one piece integral semiconductor;
   a dielectric formed upon said semiconductor;
   an anode electrically isolated from said semiconductor by said dielectric;
   a microcavity penetrating said dielectric and said anode, and extending into said semiconductor, said microcavity defining a hollow cathode in said semiconductor; and
   discharge filler within said microcavity.

2. A discharge lamp according to claim 1, wherein said semiconductor is a silicon wafer.

3. A discharge lamp according to claim 1, wherein said microcavity has a maximum aperture in the approximate range of from about 1 to 400 $\mu$m.

4. A discharge lamp according to claim 1, wherein said microcavity has a maximum aperture of in the approximate range of from about 1 to 400 $\mu$m.

5. A discharge lamp according to claim 4, wherein said microcavity has a depth to aperture ratio exceeding about 4:1.

6. A discharge lamp according to claim 5, wherein said discharge filler has a pD of about 20 Torr-mm or more and produces a hollow cathode discharge.

7. A discharge lamp according to claim 1, further comprising a layer having a reservoir formed therein which contains reserve discharge filler, said layer being bonded to said one piece integral semiconductor so that said reservoir is aligned with and in gaseous contact with said microcavity.

8. A discharge lamp according to claim 1, wherein said filler produces discharge in a ballistic mode.

9. A discharge lamp according to claim 1, wherein said filler produces resonance radiation.

* * * * *

UNITED STATES PATENT AND TRADEMARK OFFICE
CERTIFICATE OF CORRECTION

PATENT NO. : 6,016,027
DATED : January 18, 2000
INVENTOR(S) : DeTemple et al.

It is certified that error appears in the above-identified patent and that said Letters Patent is hereby corrected as shown below:

Column 1, line 2, insert new paragraph --This invention was made with Government support under Grant No. F49620-95-1-0238 awarded by AFOSR and under Grant No. ECD 89-43166 awarded by NSF. The Government has certain rights in the invention.--

Signed and Sealed this

Twenty-seventh Day of March, 2001

Attest:

NICHOLAS P. GODICI

*Attesting Officer*       *Acting Director of the United States Patent and Trademark Office*